United States Patent [19]

Bricaud et al.

[11] Patent Number: 4,701,829
[45] Date of Patent: Oct. 20, 1987

[54] THERMAL CONNECTOR FOR PRINTED CIRCUIT CARD EQUIPPED WITH ELECTRONIC COMPONENTS

[75] Inventors: Herve Bricaud, Toulouse; Dominique Bertho, Sarbrouville, both of France

[73] Assignee: Amphenol Corporation, Wallingford, Conn.

[21] Appl. No.: 851,646

[22] Filed: Apr. 14, 1986

[30] Foreign Application Priority Data

Apr. 16, 1985 [FR] France ................................. 85 05715

[51] Int. Cl.⁴ .............................................. H05K 7/20
[52] U.S. Cl. ..................................... 361/386; 165/185
[58] Field of Search ............................... 361/380–382, 361/386–389, 415; 174/16 HS; 165/80.4, 80.5, 80.2, 185

[56] References Cited

U.S. PATENT DOCUMENTS 3,992,653 11/1976 Richardson et al. ............... 361/388
4,298,904 11/1981 Koenig ................................. 361/386
4,322,776 3/1982 Job et al. ............................. 361/386
4,480,287 10/1984 Jensen ................................. 361/388
4,498,119 2/1985 Cronin ................................. 361/386

FOREIGN PATENT DOCUMENTS 0091335 10/1983 European Pat. Off. .
2514601 10/1981 France .

Primary Examiner—Roy N. Envall, Jr.
Attorney, Agent, or Firm—Bacon & Thomas

[57] ABSTRACT

The present invention relates to a thermal connector for printed circuit card mounted with at least one electronic component, the card having a heat-conducting substrate. The connector has at least one wall made of a material which is a good heat conductor in direct contact with a part of the heat-conducting substrate and a means forming a heat sink integral with the wall.

The invention applies in particular to electronic cabinets comprising a large number of cards.

14 Claims, 8 Drawing Figures

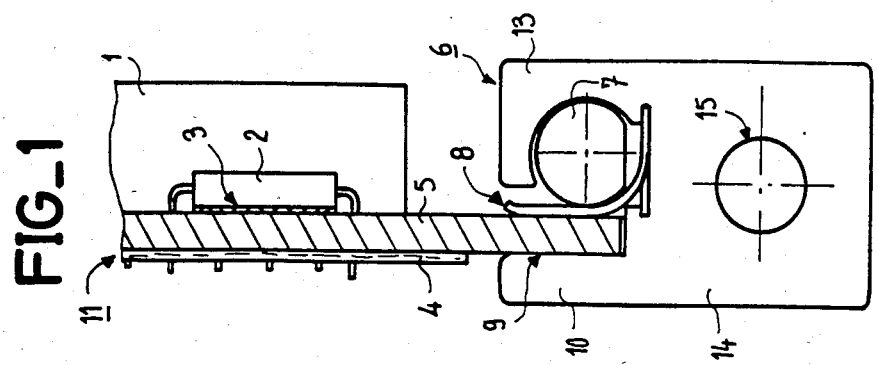
FIG_1
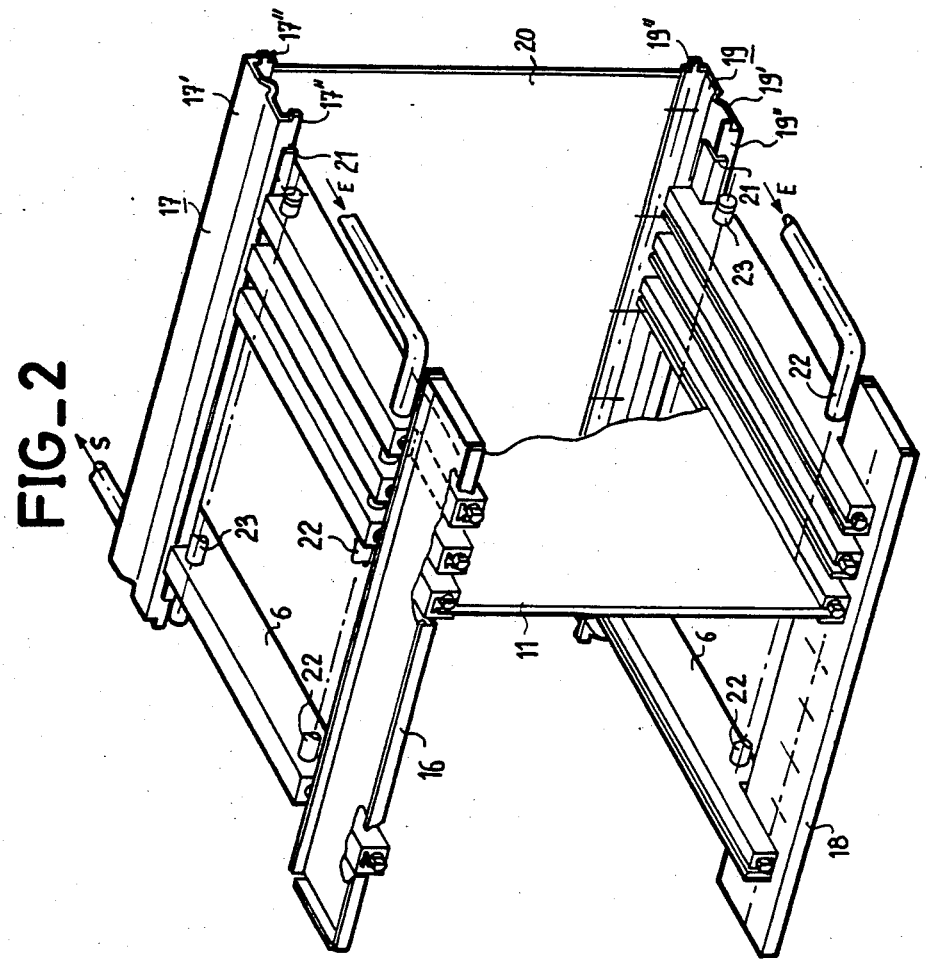
FIG_2

FIG_3
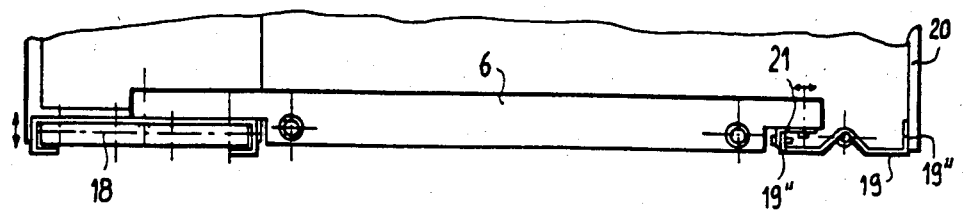
FIG_4
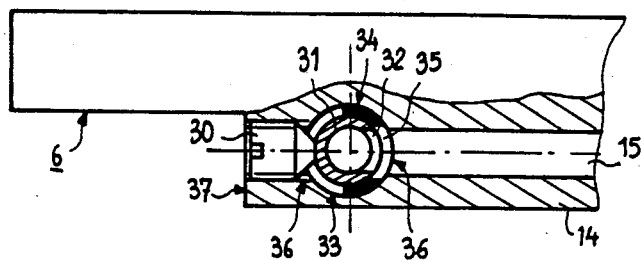
FIG_5
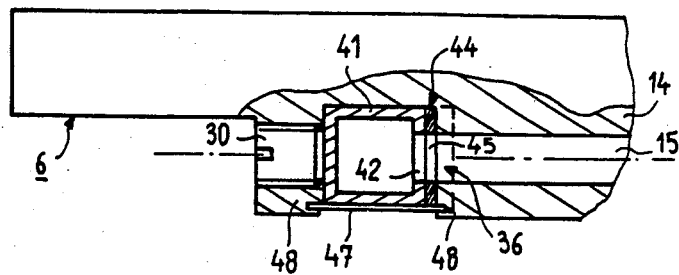

FIG_6-a
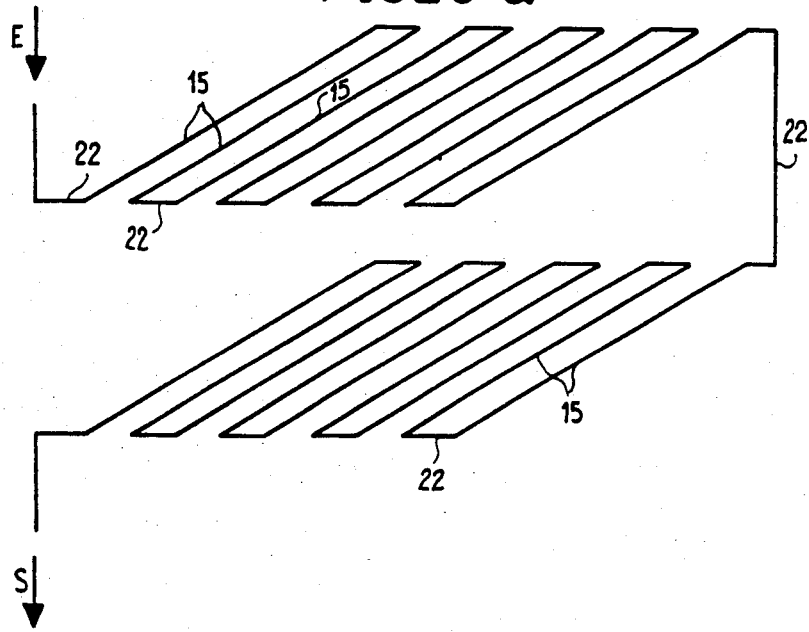
FIG_6-b
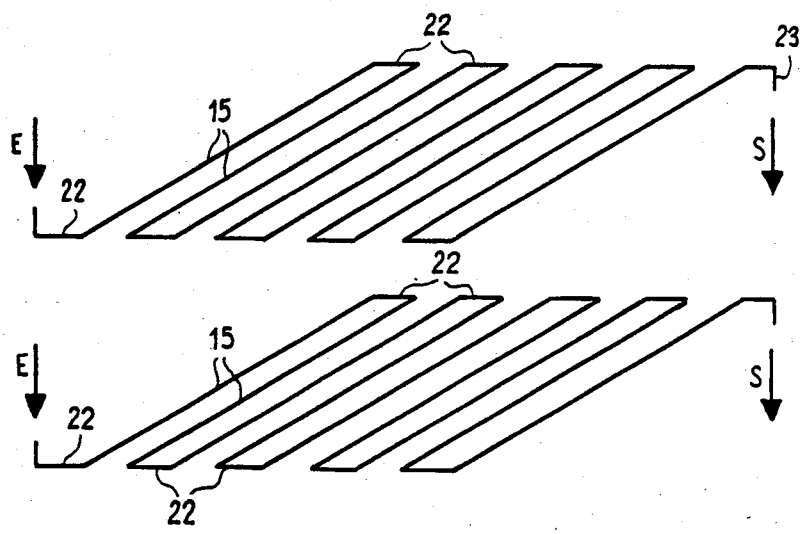

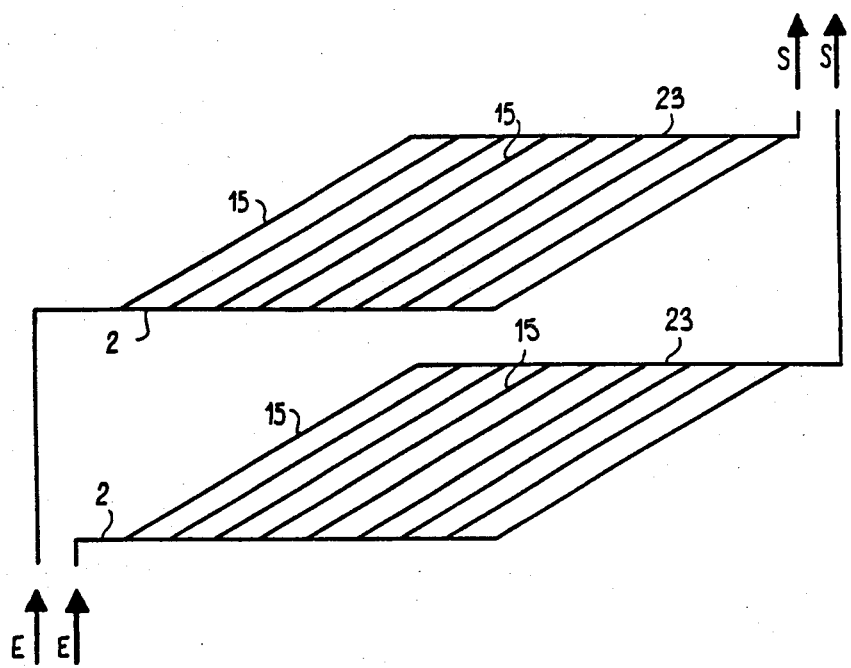
FIG_6-c

THERMAL CONNECTOR FOR PRINTED CIRCUIT CARD EQUIPPED WITH ELECTRONIC COMPONENTS

BACKGROUND OF THE INVENTION

1. Field of the Invention

The present invention relates to a thermal connector for a printed circuit card equipped with electronic components dissipating heat, the connector being intended more particularly for electronic cabinets with a high density of cards.

2. Description of the Prior Art

The problem of thermal connection appears in particular in electrical apparatus or equipment having a large number of cards equipped with electronic components, because some of these components dissipate a large amount of heat which should be evacuated under the best possible conditions in order to keep the components under acceptable working conditions. It is known, for example, that integrated circuits contain more and more functions and elements integrated on the semiconductor chip and that the amount of heat dissipated increases correlatively. In order not to damage the circuits or reduce their lifetime, their working junction temperature should not exceed about 125° C., and hence it is desirable to evacuate the heat dissipated by these circuits as fast as possible.

To do this, it is common practice to use printed circuit cards equipped with a heat-conducting substrate. Such cards are described, for example, in French patent application No. 82 05253 published under U.S. Pat. No. 2,524,250. These cards are generally mounted in connectors linking the heat-conducting substrate of the card with the cold wall or walls of the electronic equipment to be cooled. The cold walls then carry the heat units toward the heat sink of the system. In the case of the thermal connectors described above, the heat conduction chain contains the following links:

- the coupling resistance of the housing on the card,
- the transverse conduction resistance of the card,
- the longitudinal conduction resistance of the heat-conducting substrate of the card which is higher in proportion to the dimension of the card,
- the coupling resistance of the lateral edges of the heat-conducting substrate on the cold walls of the equipment, and
- the conduction resistance of the frame of the equipment between the cold walls and the heat sink.

This chain of heat conduction is relatively long. Thus, in order that, in particular, the last link will not alter too extensively the evacuation of the heat dissipated by the system, the dimensions of the equipment receiving this type of connector should be limited to a few dozen centimeters and the electronics should be concentrated in a limited volume. These constraints are therefore incompatible with the volume of the electronic cabinets such as, for example, the bays of telecommunication equipment or even the new generations of large satellites for which the electronic parts situated at the center are too far from the cold outside walls that radiate the heat into space.

It would be desirable to remedy these drawbacks by providing a thermal connector having a very short chain of heat conduction in which the links constituted by the cold wall and its connection to the heat sink are eliminated.

SUMMARY OF THE INVENTION

In accordance with the present invention, there is provided a thermal connector for a printed circuit card equipped with at least one electronic component, the card comprising a heat-connecting substrate, characterized in that the connector comprises at least one wall made of a good heat-conducting material in direct contact with a part of the heat-conducting substrate and a means forming a heat sink integral with the wall.

In this case, the heat conduction chain comprises the following links:

- the coupling resistance of the components on the conductive substrate,
- the transverse conduction resistance of the substrate of the card,
- the longitudinal conduction resistance of the heat-conducting substrate, and
- the coupling resistance of the lateral edges of the heat-conducting substrate directly on the heat sink.

According to a preferred embodiment, the means forming the heat sink is constituted by a heat exchanger, with circulation of a heat-carrying fluid, in the form of a block which extends the heat-conducting wall, the block being equipped with means permitting the circulation of the heat-carrying fluid. Preferably, the means permitting the circulation of the heat-carrying fluid comprises at least one duct formed in the said block, the duct being connected to channels for admitting and evacuating the fluid.

To provide the fluidic connection between each duct and one of the entry or evacuation channels of the heat-carrying fluid, the block is preferably provided with means perpendicular to the duct permitting the passage of the corresponding channel and the channel and the duct are each equipped with orifices of sufficient diameter to permit the fluidic connection of the channel and the duct.

According to a first embodiment the channel is equipped with at least one orifice of a diameter substantially equal to that of the duct and the block has a hole of a diameter larger than that of the channel, secant and perpendicular to the duct, the hole being designed to receive, with the interposition of a sealing means, one of the entry or evacuation channels for the heat-carrying fluid so that the orifice of the channel will be in communication with the duct.

According to another embodiment, the channels are in the form of tubes of rectangular or square crosssection equipped on one face with at least one orifice of a diameter substantially equal to that of the duct, and the block is equipped with a groove secant and perpendicular to the duct, the shape of the groove permitting the reception, with interposition of a sealing means, of the channel with its orifice in communication with the duct, of a means of retention keeping the channel in place in the groove.

The two modes of fluidic connection described above are particularly well suited to the case of a plurality of thermal connectors according to the present invention supplied in parallel.

According to another characteristic of the present invention, the face of the printed circuit card opposite that which is in contact with the heat-conducting wall is in contact with maintaining means integral with the conductor which presses it against the wall.

BRIEF DESCRIPTION OF THE DRAWINGS

FIG. 1 is a sectional view of a thermal connector according to the present invention mounted on the heatconducting substrate of the card.

FIG. 2 is a perspective view of a part of an opening of an electronic bay equipped with thermal connectors according to the present invention.

FIG. 3 is a view in side elevation showing the attachment of the thermal connector on the structure of the opening of the bay represented in FIG. 2.

FIG. 4 is a partial sectional view of a first embodiment of the tight fluidic connection of the thermal connector on the channel network of the equipment.

FIG. 5 is a view in partial section of another embodiment of the tight fluidic connection of the thermal connector on the network of channels of the equipment.

FIGS. 6a, 6b and 6c are schematic representations of various possibilities of circulation of the heatcarrying fluid in the set of thermal collectors of the equipment.

DESCRIPTION OF THE PREFERRED EMBODIMENTS

To simplify the description, in the different figures the same elements bear the same references.

FIG. 1 shows a printed circuit card with a heatconducting substrate mounted in an electrical connector accordng to the present invention. The card with a heat-conducting substrate includes a printed circuit 4 equipped with a heat drain (or thermal conducting layer) 5 and an electrical component 2 dissipating a large amount of heat. Between component 2 and heat drain 5 there is a thermal joint 3 which is a conductive paste facilitating the transfer of heat between the component and the drain. Heat drain 5 is plugged into a thermal connector 6 which has two substantially vertical walls 10 and 13 connected, according to the present invention, by a block 14 having a duct 15 whose function will be explained below. Vertical wall 10 is in contact with heat drain 5 along its face 9. Heat drain 5 is pressed against face 9 by a retaining means integral with the connector and comprising, in the embodiment represented, an elastic contact 8 pressing on the other face of the drain, which contact is held in position by a rotary cam 7 which, depending on its orientation, permits the introduction of the heat drain into the connector, or holds it in the latter. In the position represented in FIG. 1, the cam retains the heat drain in contact with the wall 9. This type of retaining means is known in the art and is described in particular in French Pat. No. 82 05250 published under U.S. Pat. No. 2,524,249. Of course, other types of such holding means can be utilized.

Furthermore, duct 15 of block 14 extends over the entire length of the block and permits circulation of a heat-carrying fluid, thereby providing a heat exchanger inside the connector. It will be noted, therefore, that in this case the heat conduction path between face 9 of heat drain 5 of the card and the heat sink in the form of duct 15 circulating heat-carrying fluid, is as short as possible and continues in this manner for the entire length of the card. Furthermore, between the vertical wall 10 on which drain 5 of the card and the heat sink 15 are coupled, there is no parasitic connection leading to a supplementary thermal coupling since wall 10 and block 14 generally form single, monoblock piece. This assembly is therefore made of a material which is a good conductor of heat such as, for example, aluminum or one of its alloys. Moreover, this peice can be produced, for example, by extrusion through a die having the profile of the monoblock constituted by walls 10 and 13, and block 14 pierced by duct 15.

As to the nature of the heat-carrying fluid, the latter will preferably be a liquid and can be selected, for example, from water, the alcohols such as ethanol or ethylene glycol, the fluorocarbons such as trichlorotrifluoroethane, lubricating oils, cooling oils, mineral oils, gasoline, kerosene, etc. This fluid can be taken from a fluid circuit available in the equipment or issuing from a reservoir of special heat-carrying fluid.

FIG. 2 shows an overall view in perspective of an opening of an electronic bay equipped with thermal connectors with fluid circulation according to the present invention. The general structure of the opening is well known in the art. It is embodied, in this embodiment, by welded construction technology with bent pieces of sheet steel serving respectively as upper and lower bars 16, 18 and upper and lower crosspieces 17, 19. The upper crosspiece 17 and lower crosspiece 19 have substantially U-shaped cross-sections, and have a central web 17', 19' and two vertical flanges 17'', 19''. The thermal connectors 6 according to the present invention are fixed on one of the vertical flanges of the upper crosspiece or lower crosspiece by means of an L-shaped angle piece 21, which permits a longitudinal and vertical adjustment of the connector in the opening as represented in FIG. 3. More precisely, angle piece 21 is fixed on the upper or lower crosspiece in such a way as to present a horizontal part on which one end of the thermal connector rests. The attachment is made with screws which permit the longitudinal and vertical adjustment of the connector relative to the crosspiece. Furthermore, the other end of thermal connector 6 is fixed on the planar part of upper bar 16 or lower bar 18 which has the general form of a C-shaped profile. A mother card 20 which serves as the rack and panel on which the daughter cards 11 are connected electrically, is fixed at the rear of the opening on the other vertical flanges 17'', 19'' of crosspieces 17 and 19.

As shown in FIG. 2, a plurality of thermal connectors 6 according to the present invention are screwed at each of their ends, respectively, to bar 16 or 18 and crosspiece 17 or 19 thereby providing an upper row and a lower row of connectors facing and parallel to one another. The pitch between two successive connectors is a function of the thickness of the components of the corresponding daughter card 11 and can vary along the opening. Nevertheless, the distribution of the pitch of the connectors is symmetrical for the upper and lower rows of a given opening.

Furthermore, as shown in FIG. 2, each upper or lower row of thermal connectors according to the present invention is connected respectively to a channel for the admission 22 and evacuation 23 of the heat-carrying fluid. In the embodiment shown, the connection of the thermal connectors is a connection in parallel although other types of connection can be envisioned as will be explained in more detail below.

To make the connection of the admission or evacuation channels of the heat-carrying fluid with the circulation duct for heat-carrying fluid formed in the block of the thermal connector of the present invention, different types of fluidic connections can be utilized. Two particular embodiments are shown in FIGS. 4 and 5, respectively.

According to the embodiment shown in FIG. 4, a hole 33 with a diameter larger than that of duct 15 is drilled in block 14 of thermal connector 6 close to an end 36 of the duct but slightly set back from an end 37 of block 14. Hole 33 is secant and perpendicular to duct 15. In the case where the thermal connectors are connected in parallel on the channels for entry or evacuation of the heat-carrying fluid as shown in Figure 2, hole 33 passes entirely through block 14. But in the case where the thermal connectors are connected in series, as will be explained below, hole 33 stops at the position of duct 15. The part of duct 15 between hole 33 and end 37 nearest to block 14 is threaded to receive a set screw 30 whose function will be explained below. Moreover, the channel for admission or evacuation of the heat-carrying fluid comprises at least one communicating orifice 32 with a diameter approximate to that of duct 15. In the embodiment in FIG. 2, the channels for entry 22 and evacuation 23 have orifices distributed over their entire length, as a function of the pitch of the thermal connectors in the upper or lower row. Thus, the channel for admission or evacuation of heat-carrying fluid, which preferably has a diameter slightly larger than duct 15 and slightly smaller than hole 33, is introduced into hole 33 and placed so that its communicating orifice 32 will be facing orifice 36 of duct 15. Furthermore, a washer 34 having an orifice 35 equivalent to orifice 32 is suitably inserted between the channel and the inner wall of hole 33 so that orifices 32 and 35 will coincide with orifice 36. Set-screw 30 is then tightened, bearing directly on the channel so as to pres the latter on washer 34 to ensure a seal of the fluidic connection between the channel and duct 15 of thermal connector 6.

A preferred embodiment of the fluidic connection between the channels and duct 15 is shown in FIG. 5. In this case, a groove of rectangular or square section is machined in block 14 close to the end of the duct 15 but slightly set back from the end of the block 14. This groove is secant and perpendicular to duct 15. In this case the channels of admission or evacuation of the heat-carrying fluid are in the form of tubes 41 of rectangular or square section as shown in FIG. 5. These tubes are provided with an orifice 42 on one of their faces, which orifice has a diameter substantially equal to that of orifice 36 of duct 15. Channel 41 extends into the groove in block 14 so that its orifice 42 will coincide with orifice 36 with interposition of a washer 44 with an orifice 45 that laso coincides with orifice 36. Channel 41 is maintained in position in the groove by means of a retention clip 47 which engages in two slots 48 provided in block 14. Furthermore, pressure screw 30 inserted in the end of duct 15, which has been threaded as in the embodiment in FIG. 5, presses channel 41 into position against duct 15. This means of fluidic connection has a certain number of advantages. As a matter of fact, the positioning of the fluid circulation orifice of the thermal connector opposite the orifice of the entry channel is simplified due to the fact of the elimination of the rotation of the entry tube. Moreover, the washer is positioned immediately with the aid of two lips pressing on the flanks of the thermal connector. Furthermore, there is a fast disassembly and reassembly of the thermal connector without disassembling the system of channels and a fast placement of stoppers in the case where guide cards are used instead of thermal connectors.

Other types of fluidic connection can be envisioned without departing from the scope of the present invention. In addition, the two types of fluidic connections described above can be modified to fit the types of circulation adopted for the heat-carrying fluid.

As shown in FIGS. 6a to 6c, different solutions can be envisaged for the circulation of the heat-carrying fluid within an opening. In each case, E represents the entering fluid and S the exiting fluid. In the configuration shown in FIG. 6a, the heat-carrying fluid passes successively through the thermal connectors of the upper part of the opening and then through the thermal connectors of the lower part of the opening. In this case, each element is mounted in series, hence the total loss of pressure head of the circuit is equal to the sum of the losses of pressure head of all the elements. Furthermore, in this configuration the fluid passes through the thermal connectors of the upper part of the opening and then through those of the lower part of the opening. On passing through each thermal connector the temperature of the fluid gradually rises. Consequently, the temperatures of the fluid circulating in the upper and lower thermal connectors of a given card are different and the heat evacuation depends on the position of the printed circuit card in the opening.

In the configuration in FIG. 6b, the entry to the upper and lower thermal connectors are independent. The heat-carrying fluid passes successively through each thermal connector and the problem of losses of pressure head will be identical to that in FIG. 6a at the location of a row with no cumulative effect. Nevertheless, in this case the temperature of the heat-carrying fluid passing through the upper thermal connector and that of the heat-carrying fluid passing through the lower thermal connector of a given card should be identical, but the heat evacuation still depends on the position of the printed circuit card in the opening.

In the configuration in FIG. 6c, the entry of the upper row of thermal connectors is independent of that of the lower row, the heat-carrying fluid passes simultaneously in all of the thermal connectors which are supplied in parallel at the location of each row. Since each element is mounted in parallel, the loss of pressure head is identical for each element and the fluid passes simultaneously through all the elements in a configuration with minimal loss of head. The temperature of the heat-carrying fluid is therefore identical regardless of the thermal connector with equal power dissipated on the card. Where heat evacuation is concerned, it is independent of the position of the printed circuit card in the opening. Furthermore, since the entry of the upper row and the lower row of thermal connectors are independent, the temperature of the heat-carrying fluid passing through the thermal connectors in a given card should be identical.

The thermal connectors according to the present invention have numerous advantages. In particular, they permit a considerable increase in the possibilities of extraction of the heat dissipated in the opening. In fact, the heat sink of each dissipating card is then brought level with its lateral edges which reduces to a substantial extent the resistances of the chain of heat conduction between the component dissipating on the card and the heat sink provided by the heat-carrying fluid circulating in duct 15 along the entire block 14 of connector 6. Furthermore, since the width of connectors 6 is substantially identical to that of the traditional plastic card guides or of the thermal connectors now in use, the use of thermal connectors according to the present invention has no effect on the conditions of cooling by convection of the opening, such a cooling being superposed on the principal cooling conferred by thermal connectors 6 with fluid circulation. Moreover, the modular design of these connectors makes it possible to mix them in a given opening with plastic card guides or with thermal connectors now in use in order to optimize the equipment on a cost-effective basis by allotting the thermal connectors of the present invention solely to cards dissipating a high power.

We claim:

1. A thermal connector for a printed circuit card equipped with at least one electronic component, said card comprising a heat-conducting substrate, said connector being adapted to be mounted with similar connectors ina frame which receives a plurality of said cards, said connector comprising:
   an elongated unitary block having a major axis and an upper surface including a slot extending along said axis and adapted to receive said heat-conducting substrate of said card, said slot including a vertically extending wall formed of a material which is a good heat conductor;
   spring means mounted in said block adjacent to said slot and including a spring adapted to urge said heat-conducting substrate into direct contact with said wall when said card is inserted in said slot;
   an internal duct extending along said axis and located beneath said slot, said duct being adapted to receive and circulate a heat-carrying fluid to serve as a heat exchanger for said card;
   an entry channel extending into said block from and communicating with said duct for introducing said heat-carrying fluid into said duct; and
   an evacuation channel extending into said block and communicating with said duct for evacuating said heat-carrying fluid from said duct.

2. The thermal connector of claim 1, wherein said entry channel extends into a side of said block and said evacuation channel extends into a side of said block.

3. The thermal connector of claim 2, wherein said duct has a substantially circular cross-section, each of said entry and evacuation channels having at least one orificie of a diameter substantially equal to that of said duct, and said block has a hole of a diameter larger than the diameter of said orifice for receiving said channel, said hole beng secant to and perpendicular to said duct.

4. The thermal connector of claim 3, including sealing means in the form of an annular washer mounted on a wall of said orifice, the opening of said washer being of a diametear substantially equal to that of said orifice of said channel so that said orifice is in communication with said duct.

5. The thermal connector of claim 4, wherein said hole is located adjacent to but set back from an end of said duct, and including clamping means located in said duct between said end of said duct and said washer to ensure a fluidic sealing connection between said channel and said duct.

6. The thermal connector of claim 2, including a rectangular groove in said block, said groove being secant to and perpendicular to said duct, said entry and evacuation channels comprising tubes of rectangular cross-section having on one face thereof at least one orifice of a diameter substantially equal to that of said duct.

7. The thermal connector of claim 6, including sealing means between said orifice of said channel and said duct, and wherein said groove is shaped to receive said channel so that its orifice is in communication with said duct.

8. The thermal connector of claim 7, wherein said groove is located adjacent to but set back from an end of said duct, and including clamping means located in said duct between said end and said groove for pressing said channel against said duct to ensure a fluidic sealing connection between said duct and said channel.

9. The thermal connector of claim 8, including retention means for maintaining said channel in place in said groove.

10. The thermal connector of claim 9, wherein said retention means comprises a retention clip, and wherein clip-receiving slots are provided in said block adjacent to the bottom thereof and on opposite sides of said groove, said retention clip being received in said slots and being in contact with the bottom of said channel to retain said channel in said groove.

11. The thermal connector of claim 10, wherein said tubes have a square cross-section.

12. The thermal connector of claim 2, wherein said spring means includes a rotary cam for holding said spring in position.

13. An electronic bay equipped with a plurality of the thermal connectors of claim 1, said connectors extending substantially parallel to and spaced from each other, the entry and evacuation channels of each thermal connector being in communication with the entry and evacuation channels of the other connectors whereby said heat-carrying fluid may flow through said ducts of each of said connectors.

14. The electronic bay of claim 13, wherein each of said connectors has a rectangular groove on a side of said block, said groove being secant to and perpendicular to said duct, and said entry and evacuation channels comprising tubes of rectangular cross-section having on one face thereof at least one orifice of a diameter substantially equal to that of said duct.

* * * * *